United States Patent
Wu et al.

(10) Patent No.: US 7,727,882 B1
(45) Date of Patent: Jun. 1, 2010

(54) COMPOSITIONALLY GRADED TITANIUM NITRIDE FILM FOR DIFFUSION BARRIER APPLICATIONS

(75) Inventors: Wen Wu, Milpitas, CA (US); Chentao Yu, Sunnyvale, CA (US); Girish Dixit, San Jose, CA (US); Kenneth Jow, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 140 days.

(21) Appl. No.: 12/002,780

(22) Filed: Dec. 17, 2007

(51) Int. Cl.
*H01L 21/4763* (2006.01)

(52) U.S. Cl. .............. 438/627; 438/625; 438/643; 438/656; 438/675; 438/685; 257/E21.584

(58) Field of Classification Search ............. 438/603, 438/642
See application file for complete search history.

(56) References Cited

U.S. PATENT DOCUMENTS

| | | | |
|---|---|---|---|
| 4,492,620 A | 1/1985 | Matsuo et al. | |
| 4,609,903 A | 9/1986 | Toyokura et al. | |
| 5,139,825 A | 8/1992 | Gordon et al. | |
| 5,194,398 A | 3/1993 | Miyachi et al. | |
| 5,961,791 A | 10/1999 | Frisa et al. | |
| 5,962,923 A | 10/1999 | Xu et al. | |
| 6,045,666 A | 4/2000 | Satitpunwaycha et al. | |
| 6,054,382 A * | 4/2000 | Hsu et al. | 438/628 |
| 6,093,966 A | 7/2000 | Venkatraman et al. | |
| 6,140,223 A * | 10/2000 | Kim et al. | 438/629 |
| 6,191,033 B1 * | 2/2001 | Liao et al. | 438/653 |
| 6,217,721 B1 | 4/2001 | Xu et al. | |
| 6,235,163 B1 | 5/2001 | Angelo et al. | |
| 6,333,547 B1 | 12/2001 | Tanaka et al. | |
| 6,337,151 B1 | 1/2002 | Uzoh et al. | |
| 6,342,448 B1 | 1/2002 | Lin et al. | |
| 6,350,688 B1 | 2/2002 | Liu et al. | |

(Continued)

OTHER PUBLICATIONS

Makoto Ueki, Masayuki Hiroi, Nobuyuki Ikarashi, Takahiro Onomdera, Naoya Furutake, Naoya Inoue, Yoshihiro Hayashi, Effects of Ti Addition on Via Reliability in Cu Dual Damascene Interconnects, IEEE Translations on Electron Devices, vol. 51, No. 11, Nov. 2004.

(Continued)

*Primary Examiner*—N Drew Richards
*Assistant Examiner*—Kyoung Lee
(74) *Attorney, Agent, or Firm*—Weaver Austin Villeneuve & Sampson LLP

(57) ABSTRACT

A diffusion barrier film includes a layer of compositionally graded titanium nitride, having a nitrogen-rich portion and a nitrogen-poor portion. The nitrogen-rich portion has a composition of at least about 40% (atomic) N, and resides closer to the dielectric than the nitrogen-poor portion. The nitrogen-poor portion has a composition of less than about 30% (atomic) N (e.g., between about 5-30% N) and resides in contact with the metal, e.g., copper. The diffusion barrier film can also include a layer of titanium residing between the layer of dielectric and the layer of compositionally graded titanium nitride. The layer of titanium is often partially or completely converted to titanium oxide upon contact with a dielectric layer. The barrier film having a compositionally graded titanium nitride layer provides excellent diffusion barrier properties, exhibits good adhesion to copper, and reduces uncontrolled diffusion of titanium into interconnects.

40 Claims, 9 Drawing Sheets

U.S. PATENT DOCUMENTS

| | | | |
|---|---|---|---|
| 6,541,374 B1* | 4/2003 | de Felipe et al. | 438/648 |
| 6,566,246 B1 | 5/2003 | de Felipe et al. | |
| 6,569,783 B2 | 5/2003 | Uzoh et al. | |
| 6,841,044 B1 | 1/2005 | Ruzic | |
| 6,995,471 B2 | 2/2006 | Shue et al. | |
| 7,041,595 B2 | 5/2006 | Chopra | |
| 2001/0039113 A1 | 11/2001 | Blalock et al. | |
| 2001/0054769 A1* | 12/2001 | Raaijmakers et al. | 257/758 |
| 2005/0085070 A1 | 4/2005 | Park | |
| 2005/0186793 A1 | 8/2005 | Omoto et al. | |
| 2005/0255700 A1 | 11/2005 | Gopalraja et al. | |
| 2007/0020922 A1 | 1/2007 | Chiang et al. | |
| 2007/0193982 A1 | 8/2007 | Brown et al. | |
| 2007/0200243 A1 | 8/2007 | Kraus et al. | |

OTHER PUBLICATIONS

W. Wu, H-J Wu, G. Dixit, R. Shaviv, M. Gao, T. Mountsier, G. Harm, A. Dulkin, N. Fuchigami, S. K. Kailasam, E. Klawuhn, R. H. Havemann, "Ti-based Barrier for Cu Interconnect Applications", International Interconnect Technology Conference paper on Jun. 1, 2008.

G. Zhong, J. Hopwood "Ionized Titanium Deposition into High tAspect Ratio Vias and Trenches", J. Vac. Sci. Technol. B 17(2), Mar./Apr. 1999, © 1999 American Vacuum Society, pp. 405-409.

Chen, Xiaomeng; Frisch, Harry L.; Kaloyeros, Alain E.; Arkles, Barry and Sullivan, John, "Low Temperature Plasma-Assisted Chemical Vapor Deposition of Tantalum Nitride from Tantalum Pentabromide for Copper Metallization," Jan./Feb. 1999, *J. Vac. Sci. Technol.*, B 17(1), pp. 182-185.

Cheng, Peter F.; Rossnagel, S.M. and Ruzic, David N., "Directional Deposition of Cu into Semiconductor Trench Structures Using Ionized Magnetron Sputtering," Mar./Apr. 1995, *J. Vac. Sci. Technol.*, B 13(2), pp. 203-208.

Cho, Kwang-Nam; Han, Chang-Hee; Noh, Kyung-Bong; Oh, Jae-Eung; Paek, Su-Hyoun; Park, Chang-Soo; Lee, Sang-In; Lee, Moon Yong and Lee, Jong Gil, "Remote Plasma-Assisted Metal Organic Chemical Vapor Deposition of Tantalum Nitride Thin Films with Different Radicals," Dec. 1998, *Jpn. J. Appl. Phys.*, vol. 37 (1998), pp. 6502-6505.

Endle, J.P.; Sun, Y-M.; White, J.M. and Ekerdt, J.G., "X-Ray Photoelectron Spectroscopy Study of TiN Films Produced with Tetrakis (dimethylamido) Titanium and Selected N-Containing Precursors on $SiO_2$," May/Jun. 1998, *J. Vac. Sci. Technol.*, A 16(3), pp. 1262-1267.

Green, K.M.; Hayden, D.B.; Juliano, D.R. and Ruzic, D.N., "Determination of Flux Ionization Fraction Using a Quartz Crystal Microbalance and a Gridded Energy Analyzer in an Ionized Magnetron Sputtering System," Dec. 1997, *Rev. Sci. Instrum.*, 68 (12), pp. 4555-4560.

Han, Chang-Hee; Cho, Kwang-Nam; Oh, Jae-Eung; Paek, Su-Hyoun; Park, Chang-Soo; Lee, Sang-In; Lee, Moon Yong and Lee, Jong Gil, "Barrier Metal Properties of Amorphous Tantalum Nitride Thin Films Between Platinum and Silicon Deposited Using Remote Plasma Metal Organic Chemical Vapor Method," May 1998, *Jpn. J. Appl. Phys.*, vol. 37 (1998), Pt. 1, No. 5A, pp. 2646-2651.

Hayden, D.B.; Juliano, D.R.; Green, K.M., Ruzic, D.N.; Weiss, C.A.; Ashtiani, K.A. and Licata, T.J., "Characterization of Magnetron-Sputtered Partially Ionized Aluminum Deposition," Mar./Apr. 1998, *J. Vac. Sci. Technol.*, A 16(2), pp. 624-627.

Hayden, D.B.; Juliano, D.R.; Neumann, M.N.; Allain, M.C. and Ruzic, D.N., "Helion Plasma Source for Ionized Physical Vapor Deposition," 1999, *Surface and Coatings Technology*, 120-121 (1999), pp. 401-404.

Klawuhn, E.; D'Couto, G.C.; Ashtiani, K.A.; Rymer, P.; Biberger, M.A. And Levy, K.B., "Ionized Physical-Vapor Deposition Using a Hollow-Cathode Magnetron Source for Advanced Metallization," Jul./Aug. 2000, *J. Vac. Sci. Technol.*, A 18(4), pp. 1546-1549.

Lee, Hoojeong; Sinclair, Robert; Li, Pamela and Roberts, Bruce, "The Failure Mechanism of MOCVD TiN Diffusion Barrier at High Temperature," 1996, *Mat. Res. Soc. Symp. Proc.*, vol. 324, pp. 279-284.

Lucovsky, Gerald; Tsu, David V. and Markunas, Robert J., "Formation of Thin Films by Remote Plasma Enhanced Chemical Vapor Deposition (Remote PECVD)," Feb. 1990, in *Handbook of Plasma Processing Technology*, eds. Rossnagel, Cuomo and Westwood, Noyes Publications, pp. 387-408.

Musher, Joshua N. and Gordon, Roy G., "Atmospheric Pressure Chemical Vapor Deposition of Titanium Nitride from Tetrakis (diethylamido) Titanium and Ammonia," Feb. 1996, *J. Electrochem. Soc.*, vol. 143, No. 2, pp. 736-744.

Peng, Y.C.; Chen, L.J.; Hsieh, W.Y.; Yang, Y.R. and Hsieh, Y.F., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, *J. Vac. Sci. Technol.*, B 16(4), pp. 2013-2018.

Reif, Rafael, Plasma Enhanced Chemical Vapor Deposition of Thin Films for Microelectronics, Feb. 1990, in *Handbook of Plasma Processing Technology*, eds. Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai, M.H.; Sun, S.C.; Tsai, C.E.; Chuang, S.H. and Chiu, H.T., "Comparison of the Diffusion Barrier Properties of Chemical-Vapor-Deposited TaN and Sputtered TaN Between Cu and Si," May 1996, 1*J. Appl. Phys.*, 79 (9), pp. 6932-6938.

J.W. Elam, M. Shuisky, J.D. Ferguson, S.M. George, Surface chemistry and film growth TiN atomic layer deposition using TDMAT and $NH^3$, © 2003 Elsevier Science B.V., pp. 145-156.

Kazuhide Abe, Syunichi Tokitoh, Shih-Chang Chen, Jun Kanamori, and Hiroshi Onoda, "Effect of Ti insertion between Cu and TiN Layers on electromigration reliability in Cu/(Ti)/TiN/Ti layered damascene interconnects", IEEE 00CH37059. 38th Annual International Reliability Physics Symposium, San Jose, California, 2000, pp. 333-338.

U.S. Office Action mailed on Jun. 15, 2004 for U.S. Appl. No. 10/289,237.

U.S. Office Action mailed on Jul. 31, 2002 for U.S. Appl. No. 09/862,539.

U.S. Office Action for U.S. Appl. No. 12/154,984 mailed Oct. 6, 2009.

D'Couto et al. J. Vac. Sci. Technol. B. 2001, 19(1), pp. 244-249.

* cited by examiner

COMPOSITIONALLY GRADED TITANIUM NITRIDE FILM FOR DIFFUSION BARRIER APPLICATIONS

FIELD OF THE INVENTION

The present invention pertains to the field of integrated circuit (IC) fabrication. In particular, the present invention pertains to diffusion barrier films. The present invention also pertains to methods and apparatus for depositing titanium-containing diffusion barrier layers for use as copper diffusion barrier films in Damascene processing.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal (such as copper) is deposited onto a patterned dielectric to fill the vias and trenches formed in the dielectric layer. The resulting metallization layer is typically formed either directly on a layer carrying active devices or on another metallization layer. A stack of several metallization layers can be formed by Damascene processing. The metal-filled lines of this stack serve as conducting paths of an integrated circuit.

Before the metal is deposited into the vias and trenches, the patterned dielectric layer is lined with a thin layer of diffusion barrier material (e.g., Ta, $TaN_x$, or $Ta/TaN_x$ bi-layer), and, subsequently, with a thin layer of seed layer material (e.g., Cu or copper alloy). The diffusion barrier layer protects inter-metal dielectric (IMD) and active devices from diffusion of copper and other readily diffusing metals into these regions. The seed layer facilitates deposition of metal into the vias and trenches. For example, in a typical process, a $TaN_x/Ta$ diffusion barrier bi-layer is deposited onto a patterned dielectric by physical vapor deposition (PVD), followed by deposition of a thin copper seed layer also by PVD. The partially fabricated IC device is then transferred to an electrofill apparatus, where the seed layer serves as a cathode during electrodeposition, and where the vias and trenches are filled with copper.

The ongoing miniaturization of IC devices demands superior electrical properties from both the dielectric and conductive materials used in IC fabrication. As the features of IC devices continue to shrink, it becomes more common to use dielectrics with very low dielectric constants (k). The low-k dielectric materials used in IC fabrication include carbon doped silicon dioxide, hydrogenated silicon oxycarbides (Si-COH), fluorine doped silicon dioxide, and organic-containing low-k dielectrics. These materials, due to their low dielectric constants, provide low parasitic capacitance and minimize the "crosstalk" between the interconnects in an integrated circuit.

SUMMARY OF THE INVENTION

Low-k dielectric materials with k less than about 2.8 and ultra low-k (ULK) dielectric materials with k less than about 2.5, however, are not always compatible with conventionally used diffusion barrier films, such as with tantalum-based diffusion barriers. For many of these dielectric materials, especially for those containing residual moisture, the use of tantalum-based diffusion barriers results in structures having inadequate diffusion barrier protection, due to partial oxidation of tantalum to tantalum oxide. Tantalum oxide formed upon oxidation, exhibits poor adhesion to copper layers, and ultimately contributes to decreased reliability of formed interconnects.

Titanium-based diffusion barriers, on the contrary, can be used in conjunction with dielectric materials containing residual moisture, such as with ULK dielectrics deposited by a spin-on method. When oxidized upon contact with moisture, titanium forms titanium oxide which does not substantially decrease the barrier properties of the diffusion barrier layer. In addition, titanium is less expensive than tantalum, and is, therefore, titanium-based diffusion barriers are more desirable from the economic standpoint.

The use of titanium-based diffusion barriers, however, presents several challenging problems. First, unlike tantalum, titanium readily diffuses into copper region of an interconnect, leading to increased interconnect resistivity. This is an undesired effect, since highly conductive interconnects are needed. In addition, titanium residing in the barrier layer is constantly depleted due to such diffusion. While it is possible to use titanium nitride diffusion barrier that does not lose titanium due to such diffusion, the use of stoichiometric or nitrogen-rich titanium nitride leads to poor adhesion at the titanium nitride/copper interface. Specifically, copper tends to agglomerate on the surface of stoichiometric or nitrogen-rich titanium nitride, resulting in interconnects having poor reliability. Thus, there is currently a need for a titanium-based diffusion barrier film with good adhesion properties exhibiting little or no diffusion of titanium.

This need is addressed herein by providing a diffusion barrier film containing a compositionally graded titanium nitride layer. Methods and apparatus for depositing such films are also provided.

A diffusion barrier film provided herein includes a layer of compositionally graded titanium nitride ($TiN_x$), having a nitrogen-rich portion and a nitrogen-poor portion. It was recognized that nitrogen-rich $TiN_x$ exhibits excellent diffusion barrier properties, while nitrogen-poor $TiN_x$ has a good adhesion to copper. The nitrogen-rich portion has a composition of preferably at least about 40% (atomic) N, and resides closer to the dielectric than the nitrogen-poor portion. The nitrogen-poor portion has a composition of preferably less than about 30% (atomic) N and resides in contact with the metal, e.g., with Cu or Cu alloy. In some embodiments the nitrogen-poor portion contains at least about 5% (atomic) N. The diffusion barrier film can also include a $Ti/TiO_x$ layer comprising a material selected from the group consisting of titanium, titanium alloy, and titanium oxide, residing between the layer of dielectric and the nitrogen-rich portion of the graded $TiN_x$ layer, in contact with these two layers. The resulting barrier film provides excellent diffusion barrier properties due to the presence of nitrogen-rich $TiN_x$, exhibits good adhesion at copper interface, due to good adhesion of nitrogen-poor $TiN_x$ to copper, and reduces uncontrolled diffusion of titanium into interconnects, because nitrogen-poor $TiN_x$ is not prone to releasing Ti into copper layers. In addition the $Ti/TiO_x$ layer has excellent compatibility with low-k spin-on dielectric materials.

According to one aspect, a method for forming a semiconductor device structure is provided. The method includes the operations of forming a first layer comprising a material selected from the group consisting of titanium, titanium alloy and titanium oxide on at least a portion of a layer of dielectric on a wafer substrate; forming a second layer comprising a compound comprising titanium and nitrogen over at least a portion of the first layer; and forming a third layer comprising copper or copper alloy over at least a portion of the second layer, wherein the second layer has a higher concentration of nitrogen at an interface with the first layer than at an interface with the third layer, and wherein the first and second layers serve as a diffusion barrier film between the copper-containing layer and the layer of dielectric.

Whereas the described diffusion barrier films can be deposited on many types of dielectric materials, they are particularly advantageous for use on low-k and ULK dielectric materials. They are also particularly useful if the dielectric contains residual moisture, e.g., after it has been deposited by a spin-on method.

The first layer, which is referred to as Ti/TiO$_x$ layer may include titanium or titanium alloy which may be partially or completely converted to titanium oxide upon deposition and contact with moisture or other oxidizing agent. The first layer is deposited in one embodiment by physical vapor deposition (PVD) by sputtering titanium from a titanium target in a PVD chamber. The thickness of the first layer may vary depending on the device requirements. In some embodiments the Ti/TiO$_x$ layer is deposited to a minimum thickness of about 15-100 Å.

The second layer, which will be referred to as a "graded titanium nitride layer" or a "graded TiN$_x$ layer" can have a composition of at least about 40% (atomic) N at the interface with the Ti/TiO$_x$ layer and less than about 30% (atomic) N at the interface with the copper-containing layer. In one embodiment, the concentration of nitrogen at the interface with the third layer is at least about 5%. Thus, the nitrogen-poor portion at the interface with the conductive third layer provides both good adhesion of barrier film to the conductive layer, and, at the same time, reduces diffusion of titanium into the interconnect.

In some embodiments, the concentration of nitrogen at the interface with the first layer is at least about 60% (atomic), and the concentration of nitrogen at the interface with the third layer is between about 5-25% (atomic).

In general, the graded titanium nitride layer may include other elements in addition to Ti and N. In many embodiments, however, it is preferred to minimize the presence of other elements, such that the layer consists essentially of TiN$_x$. For example, in some embodiments the TiN$_x$ layer is substantially oxygen-free.

The graded titanium nitride layer can be deposited by a number of methods including PVD, CVD and ALD. In some embodiments it is preferred to use the same method as was used for deposition of the first layer. For example both layers can be deposited by PVD, e.g., in one chamber without exposing the substrate to ambient atmosphere. When graded titanium nitride is deposited by PVD, a number of grading techniques can be used. For example titanium nitride may be deposited by reactive titanium sputtering in the presence of N$_2$ or other nitrogen source, wherein nitrogen source flow rate is reduced gradually or incrementally during deposition of graded TiN$_x$ layer. For example a plurality of sublayers with decreasing concentrations of nitrogen may be deposited by incrementally decreasing the nitrogen source flow rate. Thus, the graded TiN$_x$ layer can be deposited by flowing nitrogen at a first rate while sputtering titanium from a sputter target to deposit a first nitrogen-rich sub-layer of TiN$_x$, followed by flowing nitrogen at a lower rate while sputtering titanium from the target to deposit a second sublayer of TiN$_x$ having a lower nitrogen concentration.

In one example, the graded titanium layer is deposited in a PVD chamber having a titanium target configured to accept negative DC bias and a wafer pedestal configured to receive an RF bias.

In one embodiment, the following conditions are used:

| | |
|---|---|
| Substrate temperature | −10-20° C. |
| Pressure | 1.0-3.0 mTorr |
| RF substrate bias power | 0-500 W |
| DC target power | 10-30 kW |
| Nitrogen flow rate | 5-50 sccm |

While the thickness of deposited layer may depend on the requirements of a device, in some embodiments the minimum thickness of the graded TiN$_x$ layer ranges between about 15-100 Å.

After the second layer has been deposited, the third layer is deposited on top of it. The third layer is typically copper or copper alloy which serves as a seed layer for a subsequent electrofill operation. In other embodiments the third layer may be a copper-containing plug deposited directly onto the barrier layer. In some embodiments, the provided diffusion barrier layer has sufficient conductivity to serve as a barrier-seed layer for direct electrofill deposition. For example, a copper-containing plug can be electrodeposited directly onto the nitrogen-poor portion of the TiN$_x$ layer. The third layer can be deposited by a variety of methods including PVD, CVD, ALD, electroplating, electroless plating, etc. PVD is often preferred for deposition of copper seed layers, while electroplating is commonly used for deposition of copper plugs.

In some embodiments all three layers are deposited without exposing the substrate to oxygen. For example, all three layers may be deposited in a module containing one or more PVD chambers, such that the substrate is not exposed to an ambient atmosphere during deposition.

In some embodiments the substrate subjected to deposition of the barrier comprises a Damascene structure, such as a structure having a layer of exposed patterned dielectric and an exposed layer of metal.

In one embodiment, such substrate is first subjected to pre-cleaning of exposed metal prior to deposition of the Ti/TiO$_x$ layer. In some embodiments pre-cleaning, deposition of the barrier film, and deposition of the seed layer are performed without exposing the substrate to oxygen.

In one embodiment the method for forming a semiconductor device structure includes depositing a layer of low-k dielectric having a dielectric constant of less than about 2.8. The method proceeds by forming a via in the layer of dielectric to expose a layer of copper or copper alloy at the bottom of the via. After the via is formed, a layer of titanium or titanium alloy is deposited over the layer of dielectric and over the exposed metal. Titanium is partially or completely converted to titanium oxide at the interface with the dielectric. The method follows by forming a layer of titanium nitride with a graded nitrogen concentration, wherein the concentration of nitrogen is greater at the interface of the TiN$_x$ layer with the Ti/TiO$_x$ layer, than at the exposed portion of the TiN$_x$ layer. After the graded layer has been deposited, a layer of copper or copper alloy is deposited over at least a portion of the exposed TiN$_x$ layer.

In one embodiment, the method for forming a semiconductor device includes forming a layer of TiN$_x$, the layer having a nitrogen-rich portion and a nitrogen-poor portion, wherein the nitrogen-rich portion contains at least about 40 atomic % nitrogen and the nitrogen-poor portion contains between about 5-30 atomic % nitrogen; and forming a layer of copper or copper alloy over the nitrogen-poor portion of the layer of $TiN_x$.

In another aspect, the invention provides a semiconductor device structure. The structure includes a layer of dielectric material; a layer of conductive material; and a diffusion barrier film residing between the layer of dielectric material and the layer of conductive material, wherein the film includes a first layer comprising $TiO_x$ in contact with the dielectric material, and a second layer comprising $TiN_x$ having graded nitrogen concentration, in contact with the first layer and the conductive layer, wherein the second layer has a nitrogen concentration of at least about 40 atomic % at the interface with the first layer and between about 5-30 atomic % at the interface with the layer of conductive material. The layer of conductive material typically includes copper or copper alloy.

In another aspect, the invention provides an apparatus for forming a diffusion barrier layer on a wafer substrate. The apparatus includes: (a) a process chamber configured to hold a titanium target for sputtering titanium-containing materials onto the semiconductor wafer; (b) a wafer support for holding the wafer in position during deposition of the material; and (c) a controller comprising program instructions for sputtering titanium or titanium alloy from the target onto the semiconductor wafer under conditions that coat the substrate with the layer of titanium or titanium alloy; subsequently depositing a compositionally graded $TiN_x$ layer, having a nitrogen-rich portion and a nitrogen-poor portion, wherein the nitrogen-rich portion is deposited onto the layer deposited in (i), and the nitrogen-poor portion remains exposed.

These and other features and advantages of the present invention will be described in more detail below with reference to the associated drawings.

DETAILED DESCRIPTION OF PREFERRED EMBODIMENTS

Introduction and Overview

Figure 1A:
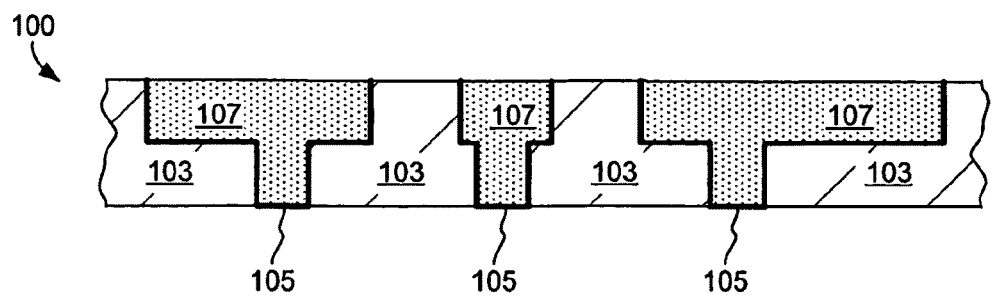
FIGS. 1A-1H show cross sectional depictions of device structures created during a copper dual Damascene fabrication process.

In the following description, the invention is presented in terms of certain specific compositions, configurations, and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

While titanium nitride exhibits excellent diffusion barrier properties and is an inexpensive material, titanium-based diffusion barrier films have not been widely used in fabrication of copper interconnects. Conventionally, tantalum-based diffusion barrier films were favored in copper Damascene processing. However, tantalum-based diffusion barrier films are not always compatible with low-k and ULK dielectric materials, particularly with dielectric materials containing residual moisture. Oxidation of tantalum to tantalum oxide leads to poor adhesion of barrier layer to copper plugs, and, consequently to decreased reliability of formed interconnects.

Titanium-based diffusion barrier films are more advantageous because oxidation of titanium results in self-limiting formation of titanium oxide which does not substantially affect diffusion barrier properties of the barrier film. However, in addition to this advantage, titanium-based diffusion barrier films present several challenging integration problems. As it was mentioned, stoichiometric or nitrogen-rich titanium nitride exhibits poor adhesion to copper layers, due to agglomeration of copper on titanium nitride surface. Further, unbound titanium metal can readily diffuse from the barrier layer into the copper interconnect, thereby decreasing the conductivity of interconnect. Such diffusion also depletes titanium in the diffusion barrier layer.

We have discovered compositions for titanium-based diffusion barrier films that are suitable for use as barriers between low-k dielectric materials and copper or copper alloys. The provided films have excellent adhesion to copper-containing layers and do not release substantial amounts of titanium into copper-containing interconnects. In general, provided films can be used as barriers between a variety of types of dielectric materials (not limited to low-k dielectric materials) and a variety of metals. While the described films address the problems encountered at the ULK dielectric/copper interface during Damascene processing, the films may be used at other interfaces and in conjunction with other processing methods, where similar problems arise.

As it was mentioned, the described films include a layer of titanium or titanium alloy (which may be partially or completely converted to $TiO_x$) in contact with the dielectric layer, and a layer of graded $TiN_x$ having a nitrogen-rich portion and a nitrogen-poor portion. The nitrogen-poor portion typically contains less than about 30 atomic % N, and contacts the copper-containing layer. Preferably, the nitrogen-poor portion contains a sufficient amount of nitrogen to minimize titanium diffusion into copper. The nitrogen-rich portion typically contains at least about 40 atomic % N, and contacts the $Ti/TiO_x$ layer.

As used in this application, "titanium nitride" and "$TiN_x$" refer to a material containing titanium and nitrogen, which may or may not be stoichiometric. "Titanium oxide" and "$TiO_x$" refer to a material containing titanium and oxygen, which may or may not be stoichiometric. A "Ti/TiO$_x$" layer refers to a layer that contains titanium metal (or alloy) and/or titanium oxide.

Damascene Process Flow

The methods for depositing the described Ti-based barrier film will be illustrated in the context of a copper dual Damascene processing. It is understood that these methods can be used in other processing methods, including single Damascene processing.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as an organic-containing low-k or ULK material) with etched line paths (trenches and vias) in which a Ti-based diffusion barrier 105, having a composition as described above, has been deposited, followed by inlaying with copper conductive routes 107 ("copper plugs"). The substrate 100 is referred to as a metallization layer. Metallization layer 100 may reside directly on a layer containing active devices containing silicon or on another metallization layer in a Damascene stack. Because copper or other mobile conductive material provides the conductive paths of the IC device, the underlying silicon devices must be protected from metal atoms (e.g., Cu) that might otherwise diffuse or migrate into the silicon. The dielectric layer 103 should also be protected from metal diffusion. Conventionally, barrier layer 105 was formed using Ta, TaN$_x$, or Ta/TaN$_x$ bi-layer. However, when used in conjunction with dielectrics having residual moisture, such as spin-on dielectric materials (e.g., porous spin-on ULK dielectrics), tantalum-based barrier layers show poor barrier performance. We discovered that excellent performance can be obtained with titanium-based barrier film which is engineered to have a compositionally graded TiN$_x$ layer. The diffusion barrier film 105 includes a Ti/TiO$_x$ layer adjacent to dielectric 103, and a graded TiN$_x$ layer which contacts copper plug 107 with its nitrogen-poor portion. In a typical process, diffusion barrier 105 is formed by a physical vapor deposition (PVD) process such as sputtering, a chemical vapor deposition (CVD) process, or an atomic layer deposition (ALD) process. In many embodiments PVD is the preferred deposition method for both layers of the barrier 105. After the barrier film has been deposited, a seed layer of metal (not shown), such as copper or copper alloy is deposited to line the wafer surface both in the field regions and within the recessed features. The copper lines 107 are then deposited by electrofill methods onto the pre-deposited seed layer. The seed layer is usually deposited by PVD, CVD, or ALD, of which PVD is most commonly used. In some embodiments, the titanium-based diffusion barrier film 105 has sufficient conductivity to serve as a barrier-seed layer, such that copper plug 107 is electrodeposited directly onto the nitrogen-poor portion of the barrier-seed layer. After fill of copper layer 107 (above the field) the excess copper is removed to the dielectric level (as well as portions of diffusion barrier 105 on the field and a portion of the dielectric). This leaves copper inlay 107 exposed on the field region for construction of additional layers. The resultant partially fabricated integrated circuit 100 is a representative substrate for subsequent Damascene processing, as depicted in FIGS. 1B-1G.

Figure 1B:
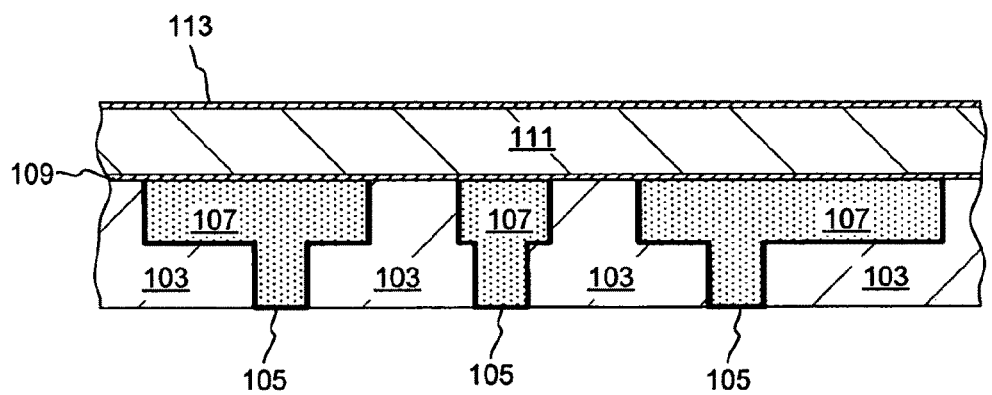

As depicted in FIG. 1B, a dielectric diffusion barrier 109 (e.g., doped or undoped silicon nitride or silicon carbide) is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of a dielectric etch-stop layer 113 (typically composed of silicon nitride or silicon carbide) on the first dielectric layer 111. Layers 109, and 113 can be deposited by CVD and plasma enhanced CVD (PECVD) methods from a variety of silicon, oxygen, carbon, and nitrogen containing precursors.

Figure 1C:
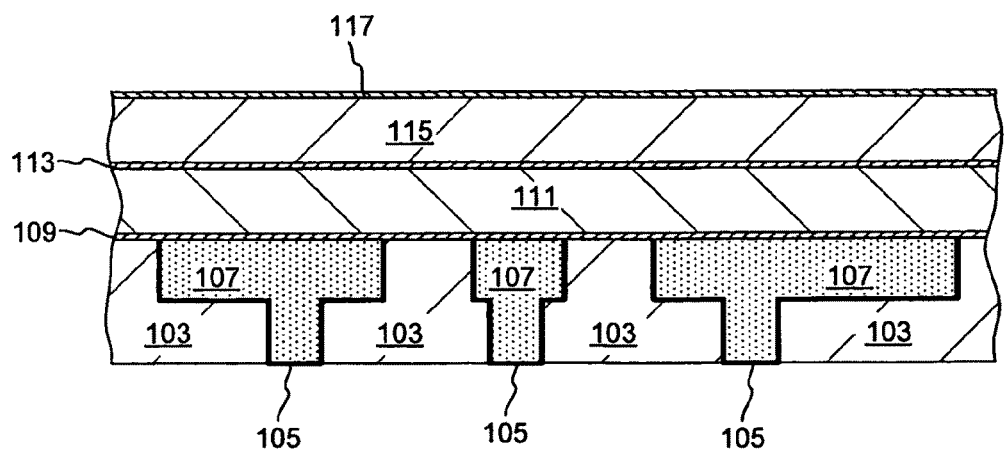

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
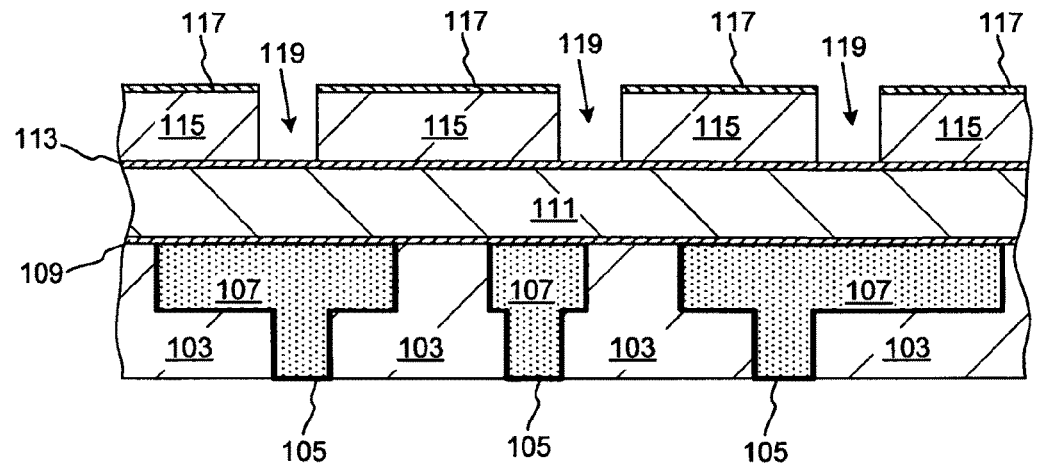
Figure 1E:
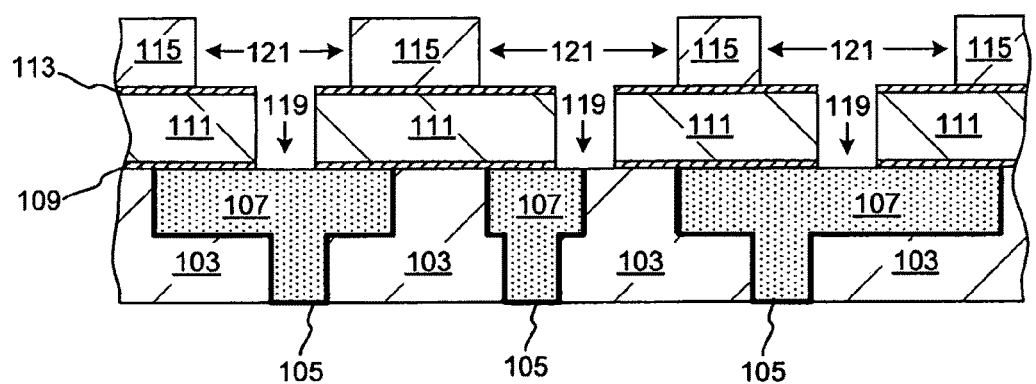

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
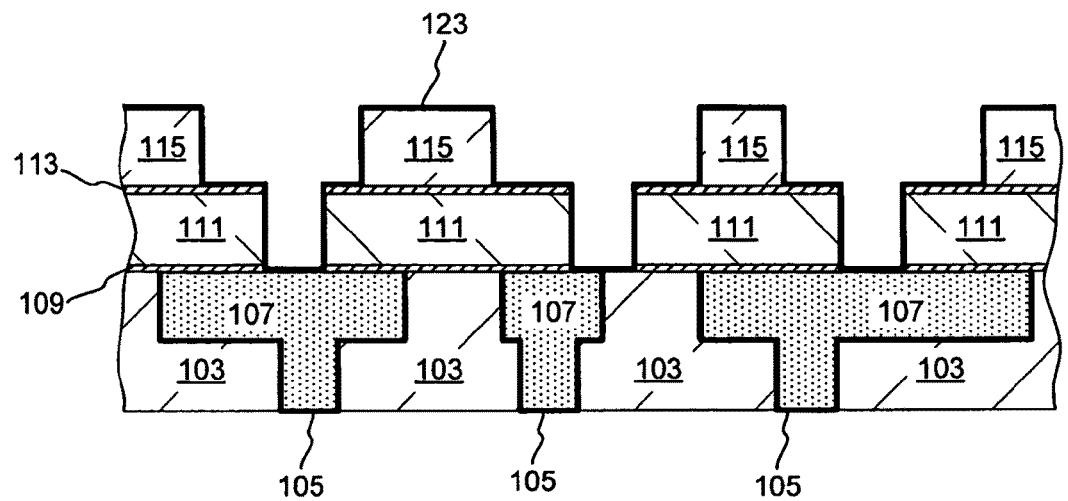

Next, as depicted in FIG. 1F, these newly formed vias and trenches are, as described above, coated with a Ti-based diffusion barrier 123. In some embodiments, a preclean process, such as Ar sputter etch or reactive preclean, may be needed prior to barrier deposition in order to remove contamination at the via bottom and ensure good ohmic contact. As mentioned above, barrier 123 is made of Ti-based film having a Ti/TiO$_x$ layer and a layer of compositionally graded TiN$_x$ layer. The diffusion barrier film is continuous and coats the substrate surface in the field region and within the recesses. The dimensions of the recessed features and the thickness of the barrier film may range depending on the type of the IC structure and the metallization layer in the Damascene stack. In some embodiments, the recesses have widths of between about 45-500 nm, and the diffusion barrier film has a minimum thickness of between about 30-200 Å. For example, the diffusion barrier film may include a Ti/TiO$_x$ layer having a thickness of about 25 Å and a layer of graded TiN$_x$ having a thickness of about 20 Å, residing on a sidewall of a feature having a width of 450 Å.

After diffusion barrier 123 is deposited, a seed layer of copper or copper alloy is applied (typically by a PVD process) to enable subsequent electrofilling of the features with copper inlay.

Figure 1G:
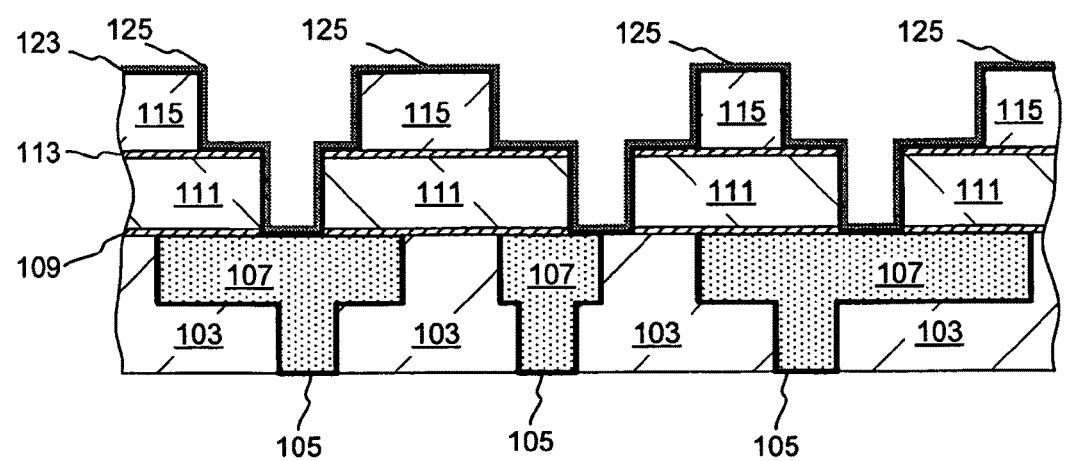
Figure 1H:
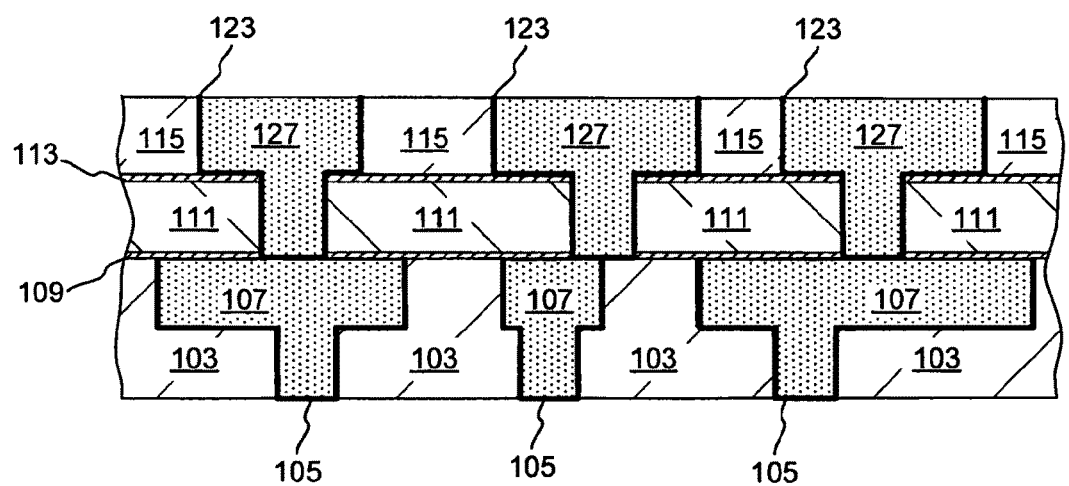

FIG. 1G depicts a copper seed layer 125 deposited on top of the diffusion barrier layer 123. The seed layer should preferably be continuous and should conformally coat the recessed features in order to support the electrofill process. After the seed layer has been deposited, the recesses are electrofilled with copper. During electrodeposition of copper, the seed layer residing on the wafer serves as a cathode with an electrical contact being made at the edge of the wafer. In some embodiments, copper is deposited directly onto the nitrogen-poor portion of the diffusion barrier layer without pre-application of a copper seed layer. After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive. While the use of titanium-based diffusion barrier layer was illustrated with the reference to formation of interconnects in the back end of the line processing, the provided diffusion barrier films can be used in other applications, e.g., in chip vias, where the thickness of barrier layers can be on the order of several microns or greater.

Diffusion Barrier Film Structure and Deposition Methods

Figure 2:
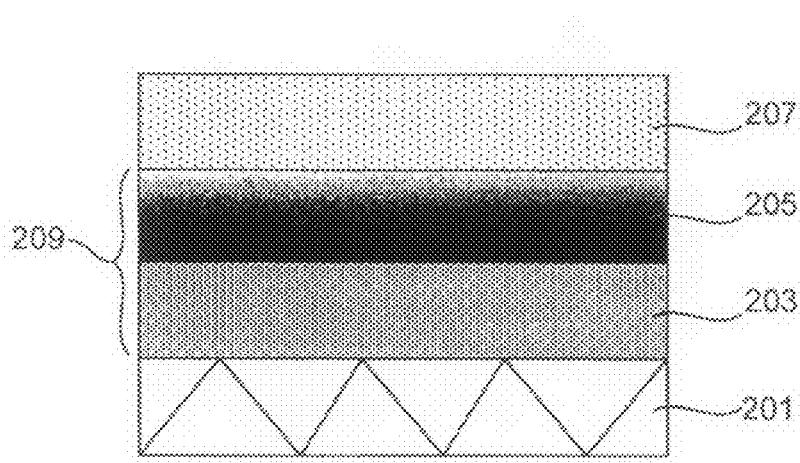
FIG. 2 presents a schematic cross-sectional depiction of a diffusion barrier film in accordance with an embodiment of the present invention.
Figure 3:
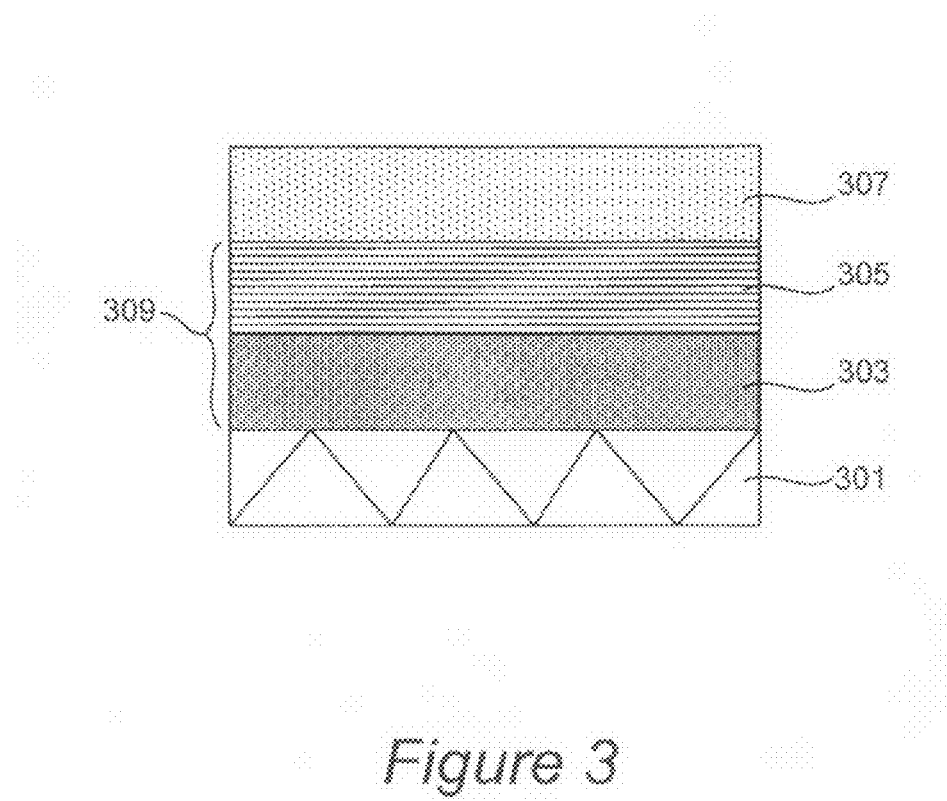
FIG. 3 shows a schematic cross-sectional depiction of a diffusion barrier film in accordance with an embodiment of the present invention.

The structures of titanium-based diffusion barrier films according to various embodiments are illustrated in FIG. 2 and FIG. 3. Example methods for barrier layer deposition are presented in process flow diagrams shown in FIG. 4 and in FIG. 5.

Diffusion barrier films are primarily used for limiting diffusion of metal from an interconnect into adjacent inter-layer dielectric (ILD). They may also serve for improving adhesion between the metal layer and the dielectric layer. A typical interface between these layers is illustrated in FIG. 2. This interface corresponds, for example, to the dielectric/barrier/metal interface depicted by layers 115, 123, and 127 respectively in FIG. 1H. Referring to the detailed view in FIG. 2, the structure includes a layer of dielectric, 201; a Ti/TiO$_x$ layer, 203; a layer of compositionally graded TiN$_x$, 205; and a layer of metal, 207. The layers are stacked in the recited order, with the dielectric layer 201 being the bottom layer of the stack. The Ti/TiO$_x$ layer 203 and the graded TiN$_x$ layer 205 together constitute the diffusion barrier film 209, which corresponds to barrier layers 123 and 105 as shown in FIG. 1H.

In the depicted stack, a layer of metal (typically copper or copper alloy) 207 resides on top of the graded TiN$_x$ layer 205. The graded TiN$_x$ layer 205 resides between the metal layer 207 and the Ti/TiO$_x$ layer 203, and contacts the layer of metal, 207, with its nitrogen-poor portion and the underlying Ti/TiO$_x$ layer 203 with its nitrogen-rich portion. The Ti/TiO$_x$ layer 203 resides on the layer of dielectric 201. In this example, the diffusion barrier film 209 consists of two layers, 203 and 205. It is understood that in other embodiments additional layers may be included into the diffusion barrier stack, as may be needed to tailor the properties of the barrier film. Yet in other embodiments the Ti/TiO$_x$ layer may be absent from the stack, and the TiN$_x$ layer may reside directly on the layer of dielectric.

Referring to FIG. 2, the layer of dielectric 201 may include a variety of dielectric materials. Typically, it is preferred to minimize the dielectric constant of ILD layer in order to minimize the RC delay in the integrated circuit device. Therefore, it is preferable to use dielectrics having a dielectric constant of less than about 4.0, preferably low-k dielectrics having a dielectric constant of less than about 2.8, and even more preferably ULK materials, having a dielectric constant of less than about 2.5, e.g., 2.1-2.3. Examples of suitable dielectric materials include porous dielectrics, carbon doped silicon dioxide, hydrogenated silicon oxycarbides (SiCOH), fluorine doped silicon dioxide, and organic-containing low-k dielectrics. ULK organic-containing materials are particularly preferred. For example, spin-on glass (SOG) low-k dielectrics including silsesquioxanes, such as alkyl substituted silsesquioxanes, for example methyl silsesquioxane (MSQ) can be used.

ULK dielectric materials are usually porous and often contain residual moisture which remains on the substrate after spin-on deposition. For such materials, and for any dielectric material containing residual moisture, titanium-based diffusion barriers are particularly advantageous. This is due to formation of titanium oxide on the surface of dielectric which has good adhesion to the dielectric and exhibits good diffusion barrier properties. Thus, a titanium-containing material capable of forming TiO$_x$ is deposited on top of dielectric. For example, titanium or titanium alloy is deposited onto dielectric layer, and is partially or completely oxidized to an oxide. Therefore, layer 203 can contain Ti, TiO$_x$ or both species.

The graded TiN$_x$ layer 205 serves both as a diffusion barrier and as an adhesion layer. The TiN$_x$ layer is deposited such that it contacts the underlying Ti/TiO$_x$ layer with its nitrogen-rich portion and the metal layer with its nitrogen-poor portion. While stoichiometric and nitrogen-rich titanium nitride exhibits poor adhesion to copper and to a variety of other metals, a nitrogen-poor titanium nitride showed excellent adhesion to copper layers. The nitrogen-rich portion of the graded layer has good diffusion barrier properties and a good adhesion to Ti/TiO$_x$ layer. Thus, the compositionally graded TiN$_x$ layer advantageously combines both good adhesion properties at both interfaces, and good barrier properties.

In some embodiments the nitrogen-rich portion of the TiN$_x$ layer has a concentration of nitrogen of at least about 40 atomic % (e.g., about 50 atomic % nitrogen), while the nitrogen-poor portion has a concentration of less than about 30 atomic % nitrogen. In some embodiments it is preferred that the concentration of nitrogen at the nitrogen-poor portion of the graded layer 205 is at least about 5% atomic. It was recognized that at such nitrogen concentration, titanium does not substantially diffuse into the copper interconnect, and, therefore, does not substantially increase the resistance of an interconnect. According to one embodiment, the nitrogen-rich portion has a nitrogen concentration of at least about 60 atomic percent, while the nitrogen-poor portion has a concentration of between about 5-30 atomic percent. While in general, the graded TiN$_x$ layer may include other elements in addition to titanium and nitrogen, in some embodiments it is preferred that this layer is substantially oxygen-free. For example, in some embodiments dioxygen is not admitted into the deposition chamber during deposition of TiN$_x$. In some embodiments, layer 205 consists essentially of TiN$_x$.

The graded TiN$_x$ layer 205 may include TiN$_x$ layer with a gradually changing nitrogen composition throughout the layer, as illustrated in FIG. 2. In this illustration, the concentration of nitrogen in layer 205 gradually decreases from the interface with layer 203 to the interface with layer 207. In other embodiments the graded TiN$_x$ layer includes multiple sub-layers with each sub-layer having a different nitrogen concentration, such that concentration of nitrogen changes in small increments throughout the layer. The number of sub-layers can range, for example, from 2 to about 200. This embodiment is illustrated in FIG. 3, where the layers are numbered analogously to FIG. 2, and layer 305 is a graded TiN$_x$, which is composed of multiple sub-layers, each sub-layer having a constant nitrogen content. The nitrogen content in layer 305 decreases in small increments from the interface with the layer 303 towards the interface with the layer 307.

Referring again to FIG. 2, the top layer 207 is a layer of metal, which may be a seed layer or the metal plug itself. While a variety of metals may be used, the described barrier film is particularly well suited for limiting diffusion of copper. Thus, in many embodiments, layer 207 is a copper or copper alloy layer.

In one embodiment the layer of dielectric 301 has a thickness of between about 1000-5000 Å, the Ti/TiOx layer 203 has a thickness of between about 15-100 Å, the graded TiNx layer 205 has a thickness of between about 15-100 Å, and the copper plug 207 has a thickness of between about 1000-5000 Å.

It is understood that during Damascene processing, the barrier layer described herein may be deposited not only over the ILD layer, but also over the layer of metal at the bottom of the vias (e.g., at the bottom of vias 119 as shown in FIG. 1E). In these instances the Ti/TiO$_x$ layer residing over metal typically will not contain substantial amounts of TiO$_x$, and therefore the conductivity of the via chain will not be greatly affected. Thus, for example, the stack at the via bottom 119 may have the structure as depicted in FIG. 2, such that 201 is a copper or copper alloy layer, 203 is a titanium layer, 205 is a graded TiN$_x$ layer, and 207 is a copper or copper alloy layer.

Figure 4:
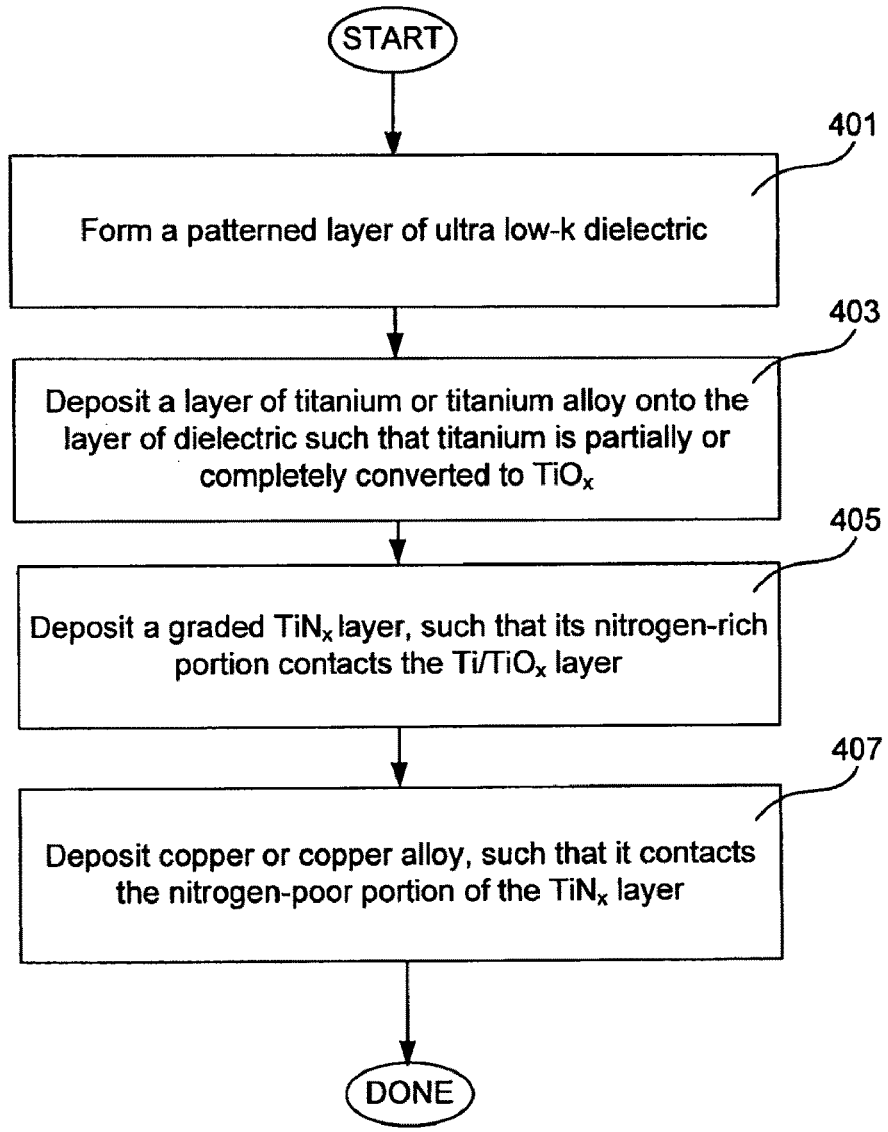
FIG. 4 shows a process flow diagram for depositing a diffusion barrier layer in accordance with an embodiment described herein.

Referring to FIG. 4, an example process flow diagram for fabricating an IC structure having a Ti-based diffusion barrier, is described. The process starts by forming a patterned layer of ULK dielectric in operation 401. ULK dielectrics having dielectric constants of less than about 2.5 include but are not limited to spin-on glasses (e.g., silsesquioxanes), organic polymers (e.g., polyimides, parylenes, aromatic ethers, etc.) and nanoporous dielectrics (e.g., xerogels, aerogels and organic nanofoams). These materials are typically deposited by a spin-on method, although for some materials CVD and PECVD deposition methods may be used. Commercially available low-k and ULK spin-on dielectrics include, for example, LKD™ dielectrics available from JSR Micro of Sunnyvale, Calif.; aromatic hydrocarbons, such as SILK™ available from Dow Chemical of Midland, Mich.; and polyarylene ethers, such as PAE-2™ available from Schumacher of Carlsbad, Calif.

Spin-on deposition methods are often more advantageous than CVD because a larger variety of low-k dielectric materials are amenable to spin-on deposition compared to CVD deposition. During spin-on deposition, spin-on low-k precursors are first dispensed onto the wafer in a liquid form. The coating is subsequently cured to expel the solvent and induce polymerization and cross-linking of the precursors forming a solvent resistant dielectric material with desirable properties. In many cases, however, curing does not completely expel residual moisture from the dielectric layer. The remaining moisture hinders integration of spin-on dielectric material with a subsequently deposited diffusion barrier layer, when a conventional tantalum-based diffusion barrier is used. As it was explained, this issue is herein addressed by providing a titanium-based diffusion barrier, in which titanium metal is oxidized to form titanium oxide upon contact with the moisture-containing dielectric.

Accordingly, after the dielectric material has been deposited and patterned by well-known photolithographic patterning methods, a layer of titanium or titanium alloy is deposited onto the layer of dielectric such that titanium is partially or completely converted to TiO$_x$ in an operation 403. In some embodiments, titanium is sputtered onto the wafer in a PVD chamber from a titanium target or coil. In one example the wafer is placed onto the wafer pedestal in a plasma PVD chamber having a titanium target configured to accept a negative DC bias and a magnetron configured to confine a plasma. An inert gas, such as helium, argon, neon, or krypton is introduced into the chamber and is ionized in a plasma, which is confined in the proximity of the target by magnetic fields. The positively charged inert gas ions (e.g., Ar$^+$ ions) impinge on a negatively biased titanium target, causing titanium sputtering. Titanium is typically sputtered in the form of neutral titanium atoms which may be subsequently ionized in a plasma. Thus, both neutral and ionized titanium may reach the wafer. The wafer pedestal may be optionally configured to accept an RF bias. Upon interaction of RF-biased wafer with the plasma, a negative DC bias is created on an RF-biased wafer, resulting in a more directional deposition of positively ionized species.

Process parameters suitable for PVD Ti/TiO$_x$ layer deposition include: substrate temperature of between about ±40° C. to 50° C.; argon flow rate ranging from about 10 to 100 sccm; pressure ranging from about 0.1 mTorr to 10 mTorr, DC target power from about 1 to 100 kW, and RF bias power at the wafer pedestal from about 0 to 1000 W. Preferably, the PVD deposition process is performed under the following conditions: substrate temperature of between about −10° C. to 20° C.; argon flow rate ranging from about 20 to 50 sccm; pressure ranging from about 0.5 to 5 mTorr, DC target power from about 10 to 70 kW, and RF bias power at the wafer pedestal from about 0 to 500 W. For example, in a specific embodiment the substrate temperature is about −10° C.; argon flow rate is about 37.5 sccm; pressure is about 1.5 mTorr; DC target power is about 30 kW; and RF bias power at the wafer pedestal is about 200 W.

After titanium is deposited onto the layer of dielectric, part of it or all of it may be oxidized to titanium oxide upon contact with dielectric. Thus, the formed Ti/TiO$_x$ layer may contain titanium, titanium alloy, titanium oxide, or mixtures thereof.

Next, in an operation 405, a graded TiN$_x$ layer is deposited, such that its nitrogen-rich portion contacts the Ti/TiO$_x$ layer. The nitrogen-rich portion contains preferably at least about 40 atomic % N. The nitrogen-poor portion of the TiN$_x$ layer is exposed at this stage, and preferably contains less than about 30 atomic % N. Preferably, the exposed portion contains at least about 5 atomic % N. For example, the exposed nitrogen-poor portion may contain between about 5-25 atomic % N. As it was explained, such graded layer provides excellent adhesion to copper seed layers or copper plugs, which was unattainable with a stoichiometric TiN layer, because copper tends to agglomerate on nitrogen-rich titanium nitride surfaces. Further, the layer exhibits good diffusion barrier properties due to the presence of a nitrogen-rich portion, which ensures that copper will be blocked from diffusing into the dielectric layer. Even further, the nitrogen-poor portion contacting the copper layer, in some embodiments, contains at least about 5 atomic percent N, and does not contain pure titanium, which might otherwise diffuse into copper and increase its resistance.

Deposition of the graded TiN$_x$ layer can be performed by PVD, CVD or ALD methods. In some embodiments graded TiN$_x$ is deposited by PVD, preferably in the same chamber which is used for Ti/TiO$_x$ layer deposition. In some embodiments, no oxygen source is introduced during TiN$_x$ deposition, such that a substantially oxygen-free TiN$_x$ is deposited.

Several techniques can be used to deposit graded TiN$_x$ in a PVD chamber. In one embodiment, deposition starts by sputtering titanium in the presence of a nitrogen source, such as N$_2$. For example, N$_2$ may be introduced into the chamber together with argon sputtering gas at a first N$_2$ flow rate. During deposition, titanium is sputtered onto the wafer and is then nitrided while residing on the wafer. The degree of nitridation can be controlled by varying the flow rate of the nitrogen source introduced into the chamber. After the first nitrogen-rich sub-layer is deposited, the deposition process is stopped (e.g., the DC bias to the target is turned off). Next, a second sub-layer with a lower concentration of nitrogen is deposited by starting the PVD process again, igniting the plasma and introducing N$_2$ at a second flow rate, which is lower than the first N$_2$ flow rate. After the second sub-layer is deposited, the deposition process is stopped, and then is again re-started to deposit a third sub-layer with a lower nitrogen content. Accordingly the third sub-layer is deposited using an even lower $N_2$ flow rate. Thus, a number of sub-layers with a decreasing nitrogen content is deposited, resulting in a graded $TiN_x$ layer. The number of sublayers may range from 2 to about 20. This deposition method gives high level of control over nitrogen content in the layer, and allows deposition of graded layers having very small thicknesses. For example each sublayer may have a maximum thickness of about 10-30 Å, e.g., about 20 Å.

Process parameters suitable for PVD $TiN_x$ layer deposition include: substrate temperature of between about −40 to 50° C.; argon flow rate ranging from about 10 to 100 sccm; nitrogen flow rate of between about 5 to 200 sccm, depending on the sub-layer deposited; pressure ranging from about 0.1 to 10 mTorr, DC target power from about 1 to 100 kW, RF bias power at the wafer pedestal from about 0 to 1000 W. Preferably, the PVD deposition process is performed under the following conditions: substrate temperature of between about −10° C. to about 20° C.; argon flow rate ranging from about 20 to 50 sccm; nitrogen flow rate of between about 5 to 50 sccm, depending on the sub-layer deposited; pressure ranging from about 0.5 to 5 mTorr; DC target power from about 10 kW to 70 kW; and RF bias power at the wafer pedestal from about 0 to 500 W. For example, in a specific embodiment the graded $TiN_x$ layer has two sublayers. The nitrogen-rich sublayer is deposited under the following conditions: the substrate temperature is about −10° C.; argon flow rate is about 37.5 sccm; nitrogen flow rate is about 35 sccm; pressure is about 1.5 mTorr; DC target power is about 30 kW; and RF bias power at the wafer pedestal is about 200 W. Then, after about 20 Å of nitrogen-rich sublayer is deposited, the deposition is stopped. The deposition of nitrogen-poor sublayer is started, which is deposited under essentially the same conditions with the $N_2$ flow rate reduced to about 15 sccm. After about 20 Å of nitrogen-poor sublayer is deposited the deposition is stopped:

In an alternative approach, the nitrogen source flow rate can be decreased in the process of deposition, without stopping the deposition before each change in the flow rate. For example, in one embodiment the graded $TiN_x$ layer is deposited in one step, such that the deposition starts at $N_2$ flow rate of about 35 sccm, and proceeds until the $N_2$ flow rate is gradually or incrementally decreased to about 15 sccm. Other deposition conditions may be the same or similar to those described above.

In yet another alternative PVD approach, the graded $TiN_x$ layer is deposited by flowing the nitrogen source (e.g., $N_2$) at a first rate and thereby depositing the nitrogen-rich portion of the layer as described above. Such deposition may result in deposition of $TiN_x$ on the titanium target. Next, deposition of nitrogen-poor portion is performed by shutting off the nitrogen source flow, and depositing the nitrogen-poor portion by sputtering with inert gas only. In this embodiment, the $TiN_x$ deposited on the target will be sputtered off as Ti and N species. The Ti will be then deposited on the wafer and will then be nitrided. Since the concentration of nitrogen atoms in the chamber is gradually decreasing, as the $TiN_x$ coating on the target is being consumed, the resulting deposited $TiN_x$ layer on the substrate will have a graded composition with a nitrogen-poor top portion. This method, however, typically offers less control over nitrogen content and $TiN_x$ layer thickness than methods using $N_2$ flow rates control.

In other embodiments, the graded $TiN_x$ layer is deposited by an ALD or a CVD method. For example, in a CVD method, a titanium-containing precursor, e.g., tetrakisdiethylamidotitanium (TDEAT), and a nitrogen-containing precursor, e.g., $NH_3$ react in a CVD chamber to deposit CVD $TiN_x$. Nitrogen-rich portion can be deposited by using a high flow rate for the nitrogen-containing precursor. After the nitrogen-rich portion has been deposited, the process is stopped, the chamber is purged and the precursors are introduced again with a lower flow rate of a nitrogen-containing precursor to deposit a layer with a lower nitrogen content. Several sub-layers may be deposited. A much greater control over the nitrogen content and the layer thicknesses is offered by ALD. In an ALD process, a titanium precursor, such as TDEAT is introduced in a pulse and is adsorbed on a substrate surface. After the chamber is purged, the nitrogen-containing reactant such as $NH_3$ is pulsed in to the chamber, e.g., concurrently with a reducing gas such as CO, and is reacted with the titanium-containing precursor to form a thin layer of $TiN_x$ on the surface of the substrate. The pulses may be repeated, e.g., up to 400 times to grow a layer of $TiN_x$ having multiple sublayers. The nitrogen content can gradually decrease throughout the layer. This may be achieved by controlling the flow rates of the nitrogen-containing precursor as well as pulse lengths. Example process parameters, which are suitable for deposition of $TiN_x$ by ALD are described in US Patent Application Publication 2007/0200243, titled "ALD FORMED TITANIUM NITRIDE FILMS" naming Kraus et al. as inventors, filed Apr. 30, 2007, which is herein incorporated by reference in its entirety and for all purposes.

After the graded $TiN_x$ layer has been deposited, the process follows by depositing a copper or copper alloy, such that it contacts the nitrogen-poor portion of the $TiN_x$ layer in operation 407. The copper-containing layer may be a thin seed layer lining the substrate in the field and within the recesses or the metal plug itself which fills the recess. In some embodiments, it is preferable to deposit a copper-containing seed layer, which will serve as a conductive cathode layer during subsequent electrofill. The copper seed layer is typically deposited by PVD in a chamber equipped with a copper target. In other embodiments, it is possible to directly deposit metal plugs onto the layer of $TiN_x$. For example, nitrogen-poor $TiN_x$ may be sufficiently conductive to allow direct electrodeposition of copper on top of $TiN_x$ layer without a need for a separate seed layer. In other embodiments metal plugs are deposited directly on top of graded $TiN_x$ layer by methods other than electrofill, e.g., by PVD or CVD.

Optionally, after the copper-containing layer has been deposited, the structure is annealed to stabilize the microstructure of copper. Annealing can be performed by heating the substrate to a temperature of between about 100-350° C., in an atmosphere containing a reducing gas, such as hydrogen. Typically an $N_2/H_2$ mixture is used for anneal.

In general, a variety of process sequences can be performed using directions provided herein. For example, a spin-on dielectric deposition, followed by PVD Ti deposition, followed by PVD graded $TiN_x$ layer deposition, followed by electrofill copper plug deposition, may be implemented. In another example, a spin-on dielectric deposition, followed by PVD Ti deposition, followed by ALD graded TiNx layer deposition, followed by PVD copper seed deposition, followed by electrofill copper plug deposition, is performed.

Figure 5:
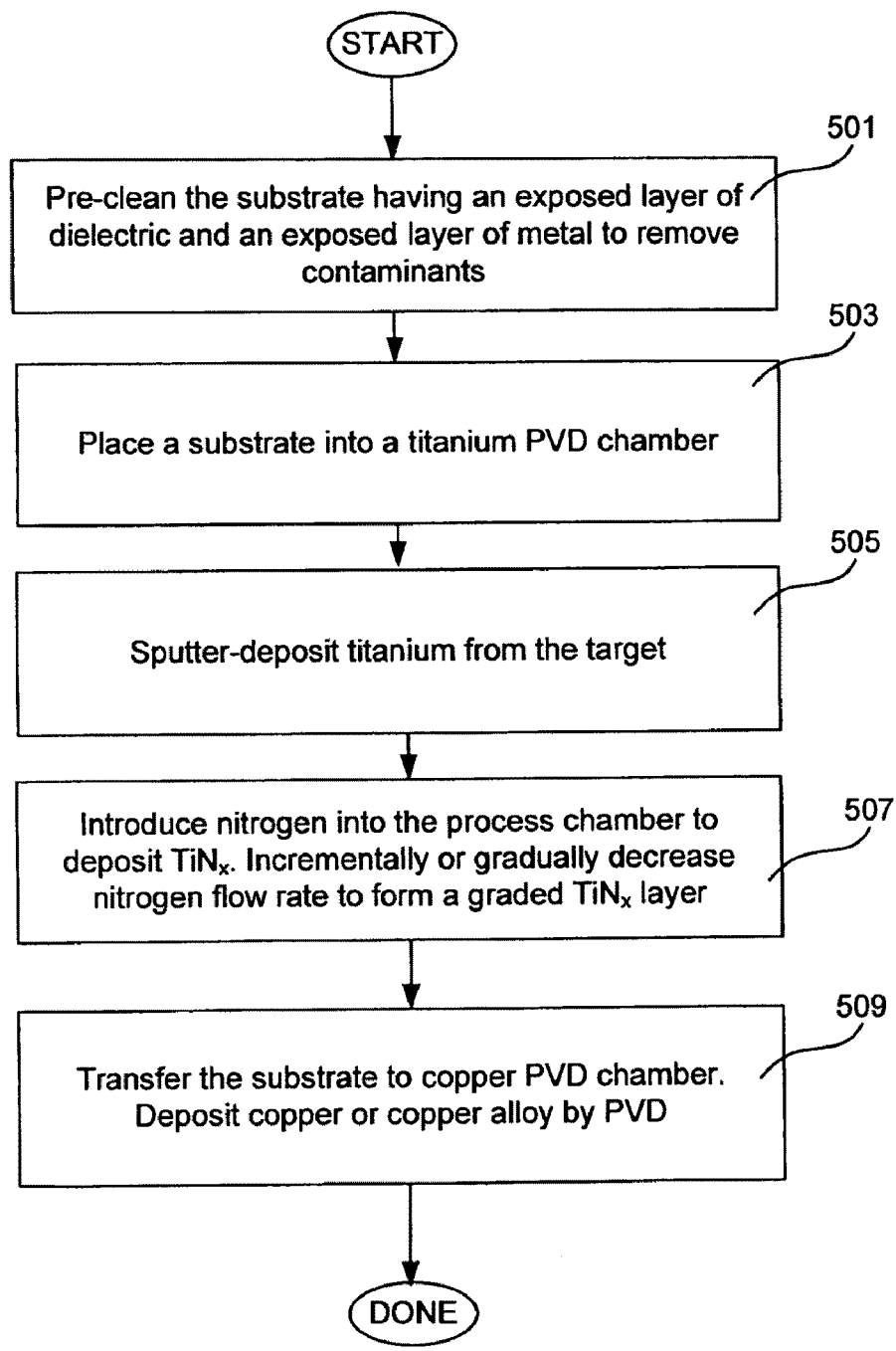
FIG. 5 shows a process flow diagram for depositing a diffusion barrier layer in accordance with an embodiment described herein.

FIG. 5 illustrates one example process flow sequence for forming an interconnect having a titanium-based diffusion barrier layer. The process is performed on a substrate having an exposed layer of patterned dielectric and an exposed metal layer. Such substrate is illustrated, for example, in FIG. 1E, where vias 119 and trenches 121 are formed in a dielectric layers 115 and 111, and a copper-containing layer 107 is exposed at the bottom portions of the vias 119. The substrate is pre-cleaned to remove contaminants in operation 501. In one embodiment pre-clean is performed in a degas chamber by exposing the substrate to high temperature (e.g., greater than about 100° C.) in a presence of a reducing gas such as hydrogen, without exposing the substrate to plasma. Such pre-clean is particularly well-suited for substrates having exposed layers of delicate low-k dielectrics (e.g., porous dielectrics), which could otherwise be easily damaged by plasma. In one embodiment, the substrate is exposed to hydrogen for about 1 minute at a wafer pedestal temperature of about 280° C. and chamber pressure of about 8 Torr. In general a variety of chambers that allow for pedestal heating and admission of reactive gases may be used. Pre-clean serves to remove metal oxide from the exposed metal surface and also removes other contaminants from the surface of the substrate. In other embodiments, when less delicate dielectric materials are employed, pre-clean can be performed in a separate plasma pre-clean chamber without a metal target by exposing the substrate to an argon plasma. It is noted that pre-clean is an optional operation in the barrier deposition process, and, in some embodiments, process flows which do not include separate, pre-clean operations may be practiced.

After pre-clean is completed, the substrate is transferred to a titanium PVD chamber without exposing the substrate to ambient atmosphere. After the substrate is placed into a titanium PVD chamber in an operation 503, the process follows by sputter-depositing titanium from the target in an operation 505. Note that in other PVD apparatus configurations, titanium may sputter deposited from the coil. After titanium is deposited onto the dielectric, it may be partially oxidized to titanium oxide, when reacted with oxidants (e.g., $H_2O$) remaining in the dielectric layer. Those portions of titanium layer which are deposited onto the metal (e.g., onto copper at the via bottom) typically remain unoxidized. The resulting $Ti/TiO_x$ layer conformally coats the substrate surface both in the field and within the recesses. The layer can have a thickness of between about 15-100 Å, referring to the thickness on the recessed feature sidewall. After the $Ti/TiO_x$ layer has been deposited, the process follows by depositing the graded $TiN_x$ layer in the same PVD process chamber. In an operation 507, nitrogen is introduced into the process chamber to deposit graded $TiN_x$. The nitrogen flow rate is decreased gradually or incrementally as was previously described with respect to FIG. 4, and a graded $TiN_x$ layer with a nitrogen concentration decreasing towards the surface is deposited. For example, a nitrogen-rich sub-layer is deposited at a first nitrogen flow rate. The deposition may then be stopped and a nitrogen-poor sub-layer is then deposited using a lower nitrogen flow rate. The graded $TiN_x$ layer conformally coats the substrate both in the field and within the recessed features. The graded $TiN_x$ layer may have a minimum thickness of between about 15-100 Å referring to the thickness on the recessed feature sidewall. The $Ti/TiO_x$ layer and the graded $TiN_x$ layer together serve as the diffusion barrier film shown as layer 123 in FIG. 1F, and layers 209 and 309 in FIGS. 2 and 3 respectively.

Referring to FIG. 5, after the diffusion barrier film is deposited, the substrate is transferred to a copper PVD chamber, where copper or copper alloy is deposited by PVD in an operation 509. In this embodiment, a copper-containing seed layer is deposited onto the exposed nitrogen-poor portion of $TiN_x$. The seed layer conformally coats the substrate both on the field and within the recesses. Such copper seed layer is illustrated, for example, in FIG. 1G, as layer 125. PVD copper seed layer may be deposited to a minimum thickness of between about 30-100 Å referring to the sidewall thickness.

The process may then follow by transferring the substrate to an electrofill apparatus, where copper is deposited into the recessed features. Excess copper and diffusion barrier is then removed from the field region by CMP resulting in a dual Damascene structure, such as shown in FIG. 1H.

In some embodiments the substrate is not exposed to dioxygen during operations 501, 503, 505, and 507, and between these operations. For example, in some embodiments pre-clean and deposition of Ti-based barrier is performed in one module having multiple chambers without exposing the substrate to $O_2$.

Apparatus

While various embodiments of the present invention can be practiced in many different types of apparatus, two main types of PVD apparatus, hollow cathode magnetron (HCM) and planar magnetron, will now be briefly described. A suitable ALD apparatus is described in detail in the US Patent Application Publication No. 2007/0200243 previously incorporated by reference, and will not be described herein.

Hollow cathode magnetron is an apparatus carrying a three-dimensional sputter target. The present invention is not limited to a specific cup-like geometry of an HCM target and can be used in conjunction with three-dimensional targets of a plurality of shapes. It is understood that in some embodiments, the graded $TiN_x$ layer is deposited by ALD.

Figure 6:
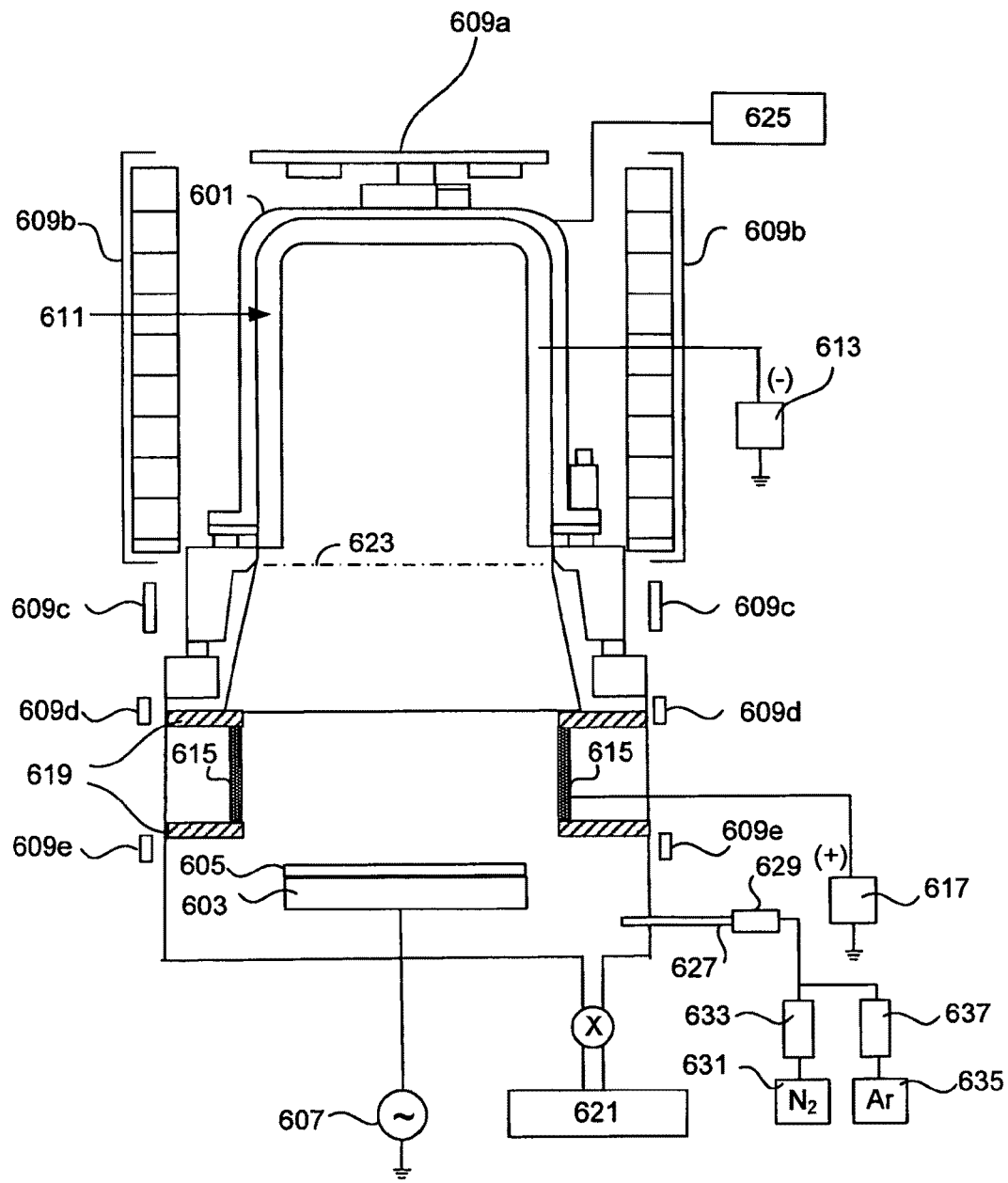
FIG. 6 is a cross sectional depiction of the hollow cathode magnetron (HCM) apparatus suitable for practicing the current invention.

FIG. 6 presents a cross sectional view of one type of an HCM sputtering apparatus in accordance with one embodiment of the invention. The HCM apparatus has two main components, the source 601, in which a plasma is created and maintained, and the RF bias electrostatic chuck (ESC) pedestal 603, which secures the wafer 605 and applies a negative RF bias on the wafer if needed. A separate RF power supply 607 is electrically connected to the wafer pedestal and provides the RF bias to the pedestal 603 when required, leading to generation of a negative DC bias at the wafer, upon interaction of the biased wafer with the plasma. An RF bias power of between about 0-500 W can be applied during deposition of Ti and $TiN_x$ layers. In many embodiments, RF bias is not used during deposition. The ESC pedestal 603 also serves to provide the temperature control for the wafer 605. The temperature at the wafer pedestal can range from about −50 to 600° C., preferably between about −10 and 20° C.

In this example, the HCM contains a top rotating magnet 609a, several annular side electromagnets 609b-609e, circumferentially positioned around the process chamber, and a sputter target 611, operated at a negative DC bias. The sputter target is electrically connected to the DC target power supply 613. A DC bias power of between about 1-100 kW, preferably between about 10-30 kW is applied to the target during diffusion barrier film deposition.

One or several shields may be positioned within the chamber next to the chamber sidewalls, to protect the sidewalls from the sputtered material. In the provided configuration, the shield 615 is positively biased and serves as an "ion extractor", configured to increase plasma density in the proximity of the wafer by transferring ions from a high plasma density region to the wafer region. The ion extractor 615 is electrically connected to a separate DC power supply 617 and is configured to accept a positive bias from the power supply 617. A positive bias of at of at least about 30 V, even more preferably between about 100 V and about 150 V is applied to the ion extractor. In one implementation, a power ranging from about 10 and 600 W is applied to the ion extractor.

The ion extractor shield 615 is electrically isolated from the process chamber sidewalls with two insulating ceramic rings 619. In the provided example, the shield 615 is an aluminum member having a hollow cylindrical shape, which is located about 8 cm above the wafer pedestal 603, and about 16 cm below the target 611. Note, that since the ion extractor is positively biased during operation of an HCM, its material is not substantially sputtered onto the wafer surface. Therefore, the ion extractor can be made of a variety of conductive materials, which may be different from the material being deposited or resputtered on the wafer. For example, an aluminum ion extractor can be used during tantalum or copper resputter.

The cathode target 611 generally has a hollow cup-like shape so that plasma formed in the source can be concentrated within this hollow region. The cathode target 611 also serves as a sputter target and is, therefore, made of a metal material which is to be deposited onto a substrate. For example, a titanium target is used for deposition of Ti and TiN$_x$ layers. A copper target is used for copper seed deposition.

A process gas, such as argon, nitrogen, or an argon/nitrogen mixture is introduced through a gas inlet 627 into the process chamber from the side, just below the ion extractor 615 (several gas inlets can be used, but one is shown to preserve clarity). A valve and a flow meter 629 can be used to control the introduction of the process gas into the chamber. In those embodiments where mixtures of argon and nitrogen are used, argon and nitrogen may be pre-mixed before entering the process chamber. The amount of nitrogen delivered from the nitrogen source 631 can be controlled using a valve and a flow meter 633. The amount of argon delivered from the argon source 635 can be controlled using a separate valve and a flow meter 637. The pump 621 is positioned to evacuate or partially evacuate the process chamber. The control of pressure in the process chamber can be achieved by using a combination of gas flow rate adjustments and pumping speed adjustments, making use of, for example, a throttle valve or a baffle plate. Typically the pressure ranges between about 0.01 mTorr to about 100 mTorr during the deposition processes.

An intense magnetic field is produced by electromagnets 609*b* within the cathode target region. The electrons emitted from the cathode are confined by the crossing electrical and magnetic fields within the hollow portion of the cathode target 611 to form a region of high plasma density within the hollow cathode. Additional electromagnets 609*c*-609*e* are arranged downstream of the cathode target and are used to shape the plasma at the elevations closer to the wafer pedestal 603. The magnetic field generated by electromagnets 609*c*-609*e* is typically less strong than the magnetic field generated by the magnets 609*a*-609*b*.

In the described embodiment, the confinement of plasma in the region of high plasma density within the hollow target 611, is further increased by the presence of a separatrix 623. Separatrix 623 is an imaginary line associated with the distribution of the magnetic field lines within the chamber, which divides the magnetic field confining the plasma within the hollow target region from the magnetic field downstream in the proximity of the wafer. The separatrix 623 includes a region of null magnetic field residing between the target 611 and the wafer 605, which allows for transfer of ions from the region of plasma confined at the target to the proximity of the wafer. Typically, in an HCM, the separatrix resides in the proximity of the target opening, but can be moved upward or downward in the chamber by the modulation of magnetic field polarity of individual magnets. The separatrix can be formed by using magnetic fields of opposite polarities to confine the upper and lower regions of plasma. The separatrix is desired for maintaining a high plasma density in the plasma region adjacent to the target, since it confines electrons and positively charged ions within this region.

In certain embodiments, a system controller 625 is employed to control process conditions during deposition of the barrier film, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, mixture of gases, flow rate of inert gas, and of nitrogen source, chamber pressure, chamber temperature, wafer temperature, RF power levels at the wafer, DC power levels at the target, polarity of electromagnetic coils 609*a-e*, power levels and current levels applied to the coils, power levels and a bias, applied to the ion extractor 615, wafer chuck or susceptor position, and other parameters of a particular process. Other computer programs stored on memory devices associated with the controller may be employed in some embodiments.

Typically there will be a user interface associated with controller 625. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, concentration of nitrogen source within the chamber, magnetic field within the chamber, plasma density within the chamber, process gas composition and flow rates, temperature, pressure, plasma conditions such as RF and DC power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck, DC power levels applied to the target, DC or RF power levels applied to the ion extractor, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing deposition of diffusion barrier film according to methods described above. For example, the instructions can specify the parameters needed to perform sputtering of Ti, followed by reactive sputtering to deposit graded $TiN_x$ layer.

Figure 7:
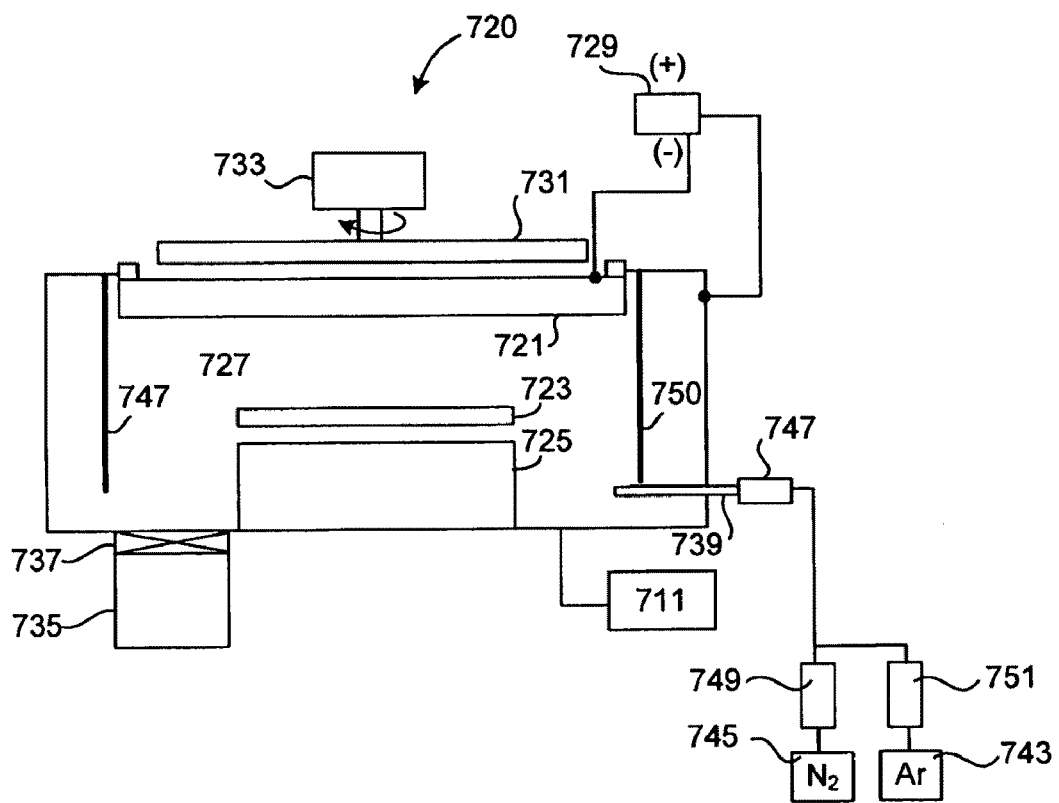
FIG. 7 is a cross sectional depiction of a planar magnetron suitable for practicing the current invention.

According to other embodiments of the invention, the diffusion barrier film can be deposited using a planar magnetron. FIG. 7 shows a schematic representation of an example planar magnetron 720. Target 721, a circular, planar block of titanium, is spaced from the wafer 723, which is mounted on a heating (or cooling) stage 725 in chamber 727. A DC power supply 729 is used to apply a DC field to target 721, establishing a plasma in the chamber below target 721. A circular magnet 731 mounted above the target is rotated by motor 733 setting up a magnetic field extending through target 721 into the region between the target 721 and wafer 723. A cryopump 735 connected to chamber 727 via valve 737 is used to evacuate the chamber. Process gas injector 739 is connected to a supply of argon 743 and a supply of nitrogen 745 via a series of valves and mass flow controllers 747, 749, and 751. In some embodiments, a separate injector and a separate mass flow controller is used for introducing an inert sputtering gas such as argon, and a reactive nitrogen source, such as $N_2$. It is understood that the structure of module 720 is exemplary only. The methods of present invention may be practiced in other types of planar magnetrons, such as ones having ICP sources. It is noted that the methods of present invention do not require the presence of an RF-biased coil within the apparatus, although they can be practiced in an apparatus equipped with such coil.

Experimental

Example experimental process parameters for a diffusion barrier deposition process are provided in Table 1. The entire deposition process was performed in a deposition chamber in an HCM using argon as a process gas during deposition of $Ti/TiO_x$ layer and using a mixture of argon and nitrogen during deposition of $TiN_x$ layer. No other gases were introduced into the chamber during deposition of diffusion barrier film. Pre-clean was performed in a degas chamber without the use of plasma.

The substrate contained an exposed layer of a low-k organic dielectric, sold under trademark HMS CORAL® by Novellus Systems Inc., of San Jose, Calif., which was pre-deposited by a spin-on method and patterned with trenches and vias having widths ranging from about 500 to 1000 Å. Copper lines were exposed at the via bottoms. The substrate was pre-cleaned in the degas chamber, by exposing the substrate to $H_2$ at about 280° C. (at wafer pedestal), and at a pressure of about 8 Torr. The $Ti/TiO_x$ and graded TiNx layers were then sequentially deposited in the PVD titanium HCM chamber under conditions described in Table 1. The $Ti/TiO_x$ layer was deposited using argon as the process gas. The graded layer was deposited by incremental deposition of 2 sublayers, each deposited using a mixture of argon and nitrogen as a process gas but at different nitrogen flow rates. The first sublayer was deposited at 35 sccm nitrogen flow rate. The second sublayer was deposited at 15 sccm nitrogen flow rate. The deposition process was stopped after deposition of each sublayer. The composition of deposited layers was subsequently determined. As shown in Table 1, the $Ti/TiO_x$ layer contains greater than 92% of Ti and less than about 8% of oxygen. The graded $TiN_x$ layer composition (averaged over entire layer) is 64% Ti, 35% N, and 1% O. It is noted that oxygen may be introduced into the layer during elemental analysis, and oxygen-free $TiN_x$ layers can be initially deposited.

TABLE 1

Example experimental process parameters for diffusion barrier deposition process, according to a method described herein.

| Parameter/Process | Deposition of $Ti/TiO_x$ layer | Deposition of graded $TiN_x$ |
|---|---|---|
| DC Target Power (kW) | 30 | 30 |
| RF Wafer Bias Power (W) | 200 | 200 |
| Nitrogen flow rate, Sccm | N.A. | First sublayer: 35 Second sublayer: 15 |
| Argon Flow Rate, Sccm | 37.5 | 37.5 |
| Pressure, mTorr | 1.5 | 1.5 |
| Thickness (Å) of deposited layer as measured in the field | 20 | First sublayer: 30 Second sublayer: 20 |
| Composition of deposited layer | O: no more than 8% Ti: more than 92% | Averaged over the layer: Ti 64%, N 35%, O 1% |

After the diffusion barrier has been deposited, the substrate was transferred to a PVD copper deposition chamber without exposing the substrate to oxygen or to ambient atmosphere, and a copper seed layer was deposited onto the nitrogen-poor portion of the TiNx layer.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a semiconductor device structure, the method comprising:
    (a) forming a first layer comprising a material selected from the group consisting of titanium, titanium alloy, and titanium oxide on at least a portion of a layer of dielectric on a wafer substrate;
    (b) forming a second layer comprising a compound comprising titanium and nitrogen over at least a portion of the first layer; and
    (c) forming a third layer comprising copper or copper alloy over at least a portion of the second layer, wherein the second layer has a concentration of nitrogen of at least about 40 atomic percent at an interface with the first layer and a concentration of nitrogen of less than about 30 atomic percent at an interface with the third layer, and wherein the first and second layers serve as a diffusion barrier film between the third layer comprising copper or copper alloy and the layer of dielectric.

2. The method of claim 1, wherein the concentration of nitrogen at the interface with the third layer is at least about 5 atomic percent.

3. The method of claim 1, wherein the concentration of nitrogen at the interface with the first layer is at least about 60 atomic percent and the concentration of nitrogen at the interface with the third layer is between about 5-25 atomic percent.

4. The method of claim 1, wherein the second layer comprises substantially oxygen-free $TiN_x$.

5. The method of claim 1, wherein forming the first layer comprises partially or completely converting titanium to titanium oxide upon titanium deposition.

6. The method of claim 5, wherein forming the first layer comprising titanium oxide comprises depositing a layer of titanium onto a layer of dielectric having residual moisture.

7. The method of claim 5, further comprising depositing the layer of dielectric by a spin-on method prior to (a).

8. The method of claim 1, wherein (b) comprises forming the second layer by physical vapor deposition (PVD).

9. The method of claim 8, wherein (b) comprises flowing nitrogen at a first rate while sputtering titanium from a target to deposit a first sub-layer of $TiN_x$, followed by flowing nitrogen at a lower rate while sputtering titanium from the target to deposit a second sublayer of $TiN_x$, wherein nitrogen concentration in the second sublayer is lower than in the first sublayer.

10. The method of claim 8, wherein (b) comprises depositing the second layer under the following conditions:

| | |
|---|---|
| Substrate temperature | −10-20° C. |
| Pressure | 1.0-3.0 mTorr |
| RF substrate bias power | 0-500 W |
| DC target power | 10-30 kW |
| Nitrogen flow rate | 5-50 sccm. |

11. The method of claim 1, comprising forming the second layer by chemical vapor deposition (CVD) or atomic layer deposition (ALD).

12. The method of claim 1, wherein the third layer is a seed layer or a metal plug.

13. The method of claim 1, further comprising providing a substrate having an exposed layer of dielectric and an exposed layer of metal prior to (a), wherein (a) comprises depositing the first layer over the exposed portions of dielectric and metal.

14. The method of claim 13, further comprising pre-cleaning the exposed metal prior to (a).

15. The method of claim 14, wherein pre-cleaning and deposition of the first, second, and third layers are performed without exposing the substrate to oxygen.

16. The method of claim 1, wherein forming the first, second, and third layers does not include exposing the substrate to oxygen.

17. The method of claim 1, wherein the substrate comprises a Damascene structure.

18. The method of claim 1, wherein the first layer has a minimum thickness of between about 15-100 Å.

19. The method of claim 1, wherein the second layer has a minimum thickness of between about 15-100 Å.

20. A method for forming a semiconductor device comprising:
    forming a layer of $TiN_x$, the layer having a nitrogen-rich portion and a nitrogen-poor portion, wherein the nitrogen-rich portion contains at least about 40 atomic % nitrogen and the nitrogen-poor portion contains between about 5-30 atomic % nitrogen; and
    forming a layer of copper or copper alloy over the nitrogen-poor portion of the layer of $TiN_x$.

21. The method of claim 20, wherein the nitrogen-rich portion contains at least about 60 atomic percent of nitrogen and wherein the nitrogen-poor portion contains between about 5-25 atomic percent of nitrogen.

22. The method of claim 20, wherein the layer of $TiN_x$ is formed by PVD.

23. The method of claim 20, wherein depositing the layer of $TiN_x$ comprises flowing nitrogen at a first rate while sputtering titanium from a target in a PVD chamber to deposit a first sub-layer of $TiN_x$, followed by flowing nitrogen at a lower rate while sputtering titanium from the target to deposit a second sublayer of $TiN_x$, wherein nitrogen concentration in the second sublayer is lower than in the first sublayer.

24. The method of claim 20, wherein the layer of copper or copper alloy is a seed layer or a copper plug in a Damascene structure.

25. The method of claim 20, wherein the layer of $TiN_x$ has a minimum thickness of between about 15-100 Å and serves as a diffusion barrier layer.

26. A method for forming a semiconductor device structure, the method comprising:
    (a) forming a first layer comprising titanium oxide by depositing a layer of titanium onto a layer of dielectric having residual moisture on a wafer substrate, wherein forming the first layer comprises partially or completely converting titanium to titanium oxide upon titanium deposition;
    (b) forming a second layer comprising a compound comprising titanium and nitrogen over at least a portion of the first layer; and
    (c) forming a third layer comprising copper or copper alloy over at least a portion of the second layer, wherein
        the second layer has a higher concentration of nitrogen at an interface with the first layer than at an interface with the third layer, and wherein the first and second layers serve as a diffusion barrier film between the third layer comprising copper or copper alloy and the layer of dielectric.

27. The method of claim 26, further comprising depositing the layer of dielectric by a spin-on method prior to (a).

28. The method of claim 26, wherein the concentration of nitrogen at the interface with the first layer is at least about 60 atomic percent and the concentration of nitrogen at the interface with the third layer is between about 5-25 atomic percent.

29. The method of claim 26, wherein the second layer comprises substantially oxygen-free $TiN_x$.

30. The method of claim 26, comprising forming the second layer by chemical vapor deposition (CVD) or atomic layer deposition (ALD).

31. The method of claim 26, wherein (b) comprises forming the second layer by physical vapor deposition (PVD), and wherein (b) comprises flowing nitrogen at a first rate while sputtering titanium from a target in a PVD chamber to deposit a first sub-layer of $TiN_x$, followed by flowing nitrogen at a lower rate while sputtering titanium from the target to deposit a second sublayer of $TiN_x$, wherein nitrogen concentration in the second sublayer is lower than in the first sublayer.

32. The method of claim 26, wherein the dielectric is a low-k dielectric having a dielectric constant of less than about 2.8.

33. The method of claim 26, wherein the first and second layers have a minimum thickness of between about 15-100 Å each.

34. A method for forming a semiconductor device structure, the method comprising:
    (a) forming a first layer comprising a material selected from the group consisting of titanium, titanium alloy, and titanium oxide on at least a portion of a layer of dielectric on a wafer substrate;

(b) forming a second layer comprising a compound comprising titanium and nitrogen over at least a portion of the first layer by physical vapor deposition (PVD), wherein forming the second layer comprises flowing nitrogen at a first rate while sputtering titanium from a target in a PVD chamber to deposit a first sub-layer of $TiN_x$, followed by flowing nitrogen at a lower rate while sputtering titanium from the target to deposit a second sublayer of $TiN_x$, wherein nitrogen concentration in the second sublayer is lower than in the first sublayer; and (c) forming a third layer comprising copper or copper alloy over at least a portion of the second layer, wherein the second layer has a higher concentration of nitrogen at an interface with the first layer than at an interface with the third layer, and wherein the first and second layers serve as a diffusion barrier film between the third layer comprising copper or copper alloy and the layer of dielectric.

35. The method of claim 34, wherein the concentration of nitrogen at the interface with the first layer is at least about 60 atomic percent and the concentration of nitrogen at the interface with the third layer is between about 5-25 atomic percent.

36. The method of claim 34, wherein forming the first layer comprises partially or completely converting titanium to titanium oxide upon titanium deposition.

37. The method of claim 34, further comprising depositing a layer of dielectric by a spin-on method prior to (a), wherein the layer of dielectric has residual moisture, and wherein (a) comprises partially or completely converting titanium to titanium oxide upon contact with the residual moisture.

38. The method of claim 34, wherein forming the first, second, and third layers does not include exposing the substrate to oxygen.

39. The method of claim 34, wherein the first layer and the second layer have a minimum thickness of between about 15-100 Å each.

40. The method of claim 34, wherein the third layer is a seed layer or a metal plug in a Damascene structure.

\* \* \* \* \*